US012772665B2

(12) United States Patent
Kim et al.

(10) Patent No.: US 12,772,665 B2
(45) Date of Patent: Oct. 20, 2026

(54) DISPLAY DEVICE

(71) Applicant: LG Display Co., Ltd., Seoul (KR)

(72) Inventors: Yongmin Kim, Paju-si (KR); SeungHee Nam, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 461 days.

(21) Appl. No.: 18/231,198

(22) Filed: Aug. 7, 2023

(65) Prior Publication Data

US 2024/0130162 A1 Apr. 18, 2024

(30) Foreign Application Priority Data

Oct. 14, 2022 (KR) ........................ 10-2022-0132686

(51) Int. Cl.
*H10K 59/122* (2023.01)
*H10K 59/80* (2023.01)

(52) U.S. Cl.
CPC ......... *H10K 59/122* (2023.02); *H10K 59/878* (2023.02)

(58) Field of Classification Search
CPC .. H10K 59/121; H10K 59/353; H10K 77/111; H10K 2102/311; H10K 59/122; H10K 59/878; H10K 59/1213; H10K 59/123; H10K 59/131; H10K 59/124; H10K 59/80518; H10K 59/8051; H10K 59/87; G09F 9/301; G09G 2300/0439; G06F 1/1641
See application file for complete search history.

(56) References Cited

U.S. PATENT DOCUMENTS

| | | | | |
|---|---|---|---|---|
| 2014/0367655 | A1 | 12/2014 | Takii | |
| 2015/0115253 | A1 | 4/2015 | Ha et al. | |
| 2019/0237523 | A1 | 8/2019 | Zhai et al. | |
| 2020/0203667 | A1* | 6/2020 | Youn | H10K 59/875 |
| 2020/0212127 | A1* | 7/2020 | Choi | H10K 50/11 |
| 2021/0014393 | A1 | 1/2021 | Hinata et al. | |
| 2021/0074955 | A1* | 3/2021 | Baek | H10K 59/124 |
| 2021/0132723 | A1 | 5/2021 | Kim et al. | |
| 2021/0407344 | A1 | 12/2021 | Lee et al. | |
| 2022/0209198 | A1 | 6/2022 | Kim et al. | |
| 2022/0285586 | A1* | 9/2022 | Yang | H10H 20/01 |

FOREIGN PATENT DOCUMENTS

| | | | |
|---|---|---|---|
| CN | 110931537 | A | 3/2020 |
| KR | 10-2014-0146677 | A | 12/2014 |
| KR | 10-2019-0069166 | A | 6/2019 |
| KR | 10-2020-0036158 | A | 4/2020 |

(Continued)

OTHER PUBLICATIONS

Translation for KR-20210053582-A (Year: 2021).*

(Continued)

*Primary Examiner* — Jacob Y Choi
*Assistant Examiner* — Ashley Nicole Blackwell
(74) *Attorney, Agent, or Firm* — Fenwick & West LLP

(57) ABSTRACT

A display device is disclosed. Specifically, there may be provided a display device capable of achieving excellent display quality in a specific viewing angle direction by including a first light emitting portion and a second light emitting portion positioned to surround a portion of a perimeter of the first light emitting portion.

8 Claims, 14 Drawing Sheets

(56) References Cited

FOREIGN PATENT DOCUMENTS

| | | | | | |
|---|---|---|---|---|---|
| KR | 10-2021-0031099 | A | | 3/2021 | |
| KR | 10-2021-0046936 | A | | 4/2021 | |
| KR | 10-2021-0054390 | A | | 5/2021 | |
| KR | 20210053582 | A | * | 5/2021 | ........... G06F 1/1652 |
| KR | 10-2022-0002005 | A | | 1/2022 | |
| KR | 20220090183 | A | * | 6/2022 | ............. G09F 9/301 |

OTHER PUBLICATIONS

Translation for KR-20220090183-A (Year: 2022).*
Intellectual Property Office of the United Kingdom, Examination Report, United Kingdom Patent Application No. GB2312745.9, Dec. 12, 2024, four pages.
Intellectual Property Office of the United Kingdom, Combined Search and Examination Report, United Kingdom Patent Application No. GB2312745.9, Feb. 14, 2024, nine pages.
Korean Intellectual Property Office, Office Action, Korean Patent Application No. 10-2022-0132686, Dec. 16, 2025, 16 pages.

* cited by examiner

100

DISPLAY DEVICE

CROSS-REFERENCE TO RELATED APPLICATION

This application claims priority from Republic of Korea Patent Application No. 10-2022-0132686, filed on Oct. 14, 2022, which is hereby incorporated by reference in its entirety.

BACKGROUND

Field

Embodiments of the disclosure relate to display devices.

Description of Related Art

A display device that implements various information as a screen is a key technology in the era of information and communication technology, and plays a role to display various information in a display area.

In order for the user to easily recognize information displayed on the display device, the display device should have excellent viewing angle characteristics. The viewing angle characteristics of the display device may mean that the display quality of the display device remains constant despite the angle at which the user views the display device.

The display device may include various light sources to display information. For example, the display device may include light emitting elements as light sources. However, since the light emitted from the light emitting element is radiated without having certain directionality, efficiency and display quality may deteriorate depending on the viewing angle.

As technology in the field of display devices develops, demand for a bendable flexible display device or a foldable display device is increasing. In a flexible display device or a foldable display device, the user uses the display device with a wider viewing angle while the display device is bent or folded. Accordingly, the flexible display device and the foldable display device are required to have better viewing angle characteristics.

SUMMARY

Display devices used for various purposes require excellent display quality in a specific viewing angle direction. However, conventional display devices do not meet the display quality. For example, in the foldable display device, the light emitted from an area symmetrical with another area adjacent to the folding axis with respect to the folding axis may be reflected in the area adjacent to the folding axis, deteriorating display quality. Thus, the inventors of the disclosure have invented a display device capable of achieving excellent display quality in a specific viewing angle direction, specifically addressing deterioration of display quality due to reflection in the area adjacent to the folding axis in the foldable display device.

Embodiments of the disclosure may provide a display device capable of achieving excellent display quality in a specific viewing angle direction by including a first light emitting portion and a second light emitting portion positioned to surround a portion of the first light emitting portion.

Embodiments of the disclosure may provide a display device capable of achieving excellent display quality in a specific viewing angle direction by including a first reflector positioned to surround at least a portion of a first opening.

In one embodiment, a display device comprises: a first subpixel; a first light emitting portion in the first subpixel; and a second light emitting portion in the first subpixel, the second light emitting portion surrounding a portion of a perimeter of the first light emitting portion without surrounding an entirety of the perimeter of the first light emitting portion in a plan view of the display device.

In one embodiment, a display device comprises: a substrate including a first subpixel; a first planarization layer on the substrate; a second planarization layer on the first planarization layer; a first electrode of the first subpixel on the first planarization layer and the second planarization layer; a bank on the first electrode, the bank including a first opening in the first subpixel; a light emitting layer on the first electrode in the first opening; and a first reflector in the first subpixel and surrounding at least a portion of the first opening, the first reflector including a portion of the first electrode on at least one of a first inclined surface of the first planarization layer that extends away from the substrate and a first inclined surface of the second planarization layer that extends away from the substrate.

A display device comprises: a substrate including a folding axis about which the display device is configured to fold; a first subpixel that is a first distance from the folding axis, the first subpixel configured to emit light with a first viewing angle; a second subpixel that is a second distance from the folding axis where the second distance is smaller than the first distance, the second subpixel configured to emit light with a second viewing angle that is different from the first viewing angle; and a third subpixel that is a third distance from the folding axis where the third distance is smaller than the second distance, the third subpixel configured to emit light with a third viewing that is different from the first viewing angle and the second viewing angle.

According to embodiments of the disclosure, there may be provided a display device capable of achieving excellent display quality in a specific viewing angle direction by including a first light emitting portion and a second light emitting portion positioned to surround a portion of the first light emitting portion.

According to embodiments of the disclosure, there may be provided a display device capable of achieving excellent display quality in a specific viewing angle direction by including a first reflector positioned to surround at least a portion of a first opening.

DESCRIPTION OF DRAWINGS

The above and other objects, features, and advantages of the disclosure will be more clearly understood from the following detailed description, taken in conjunction with the accompanying drawings, in which.

DETAILED DESCRIPTION

Figure 1:
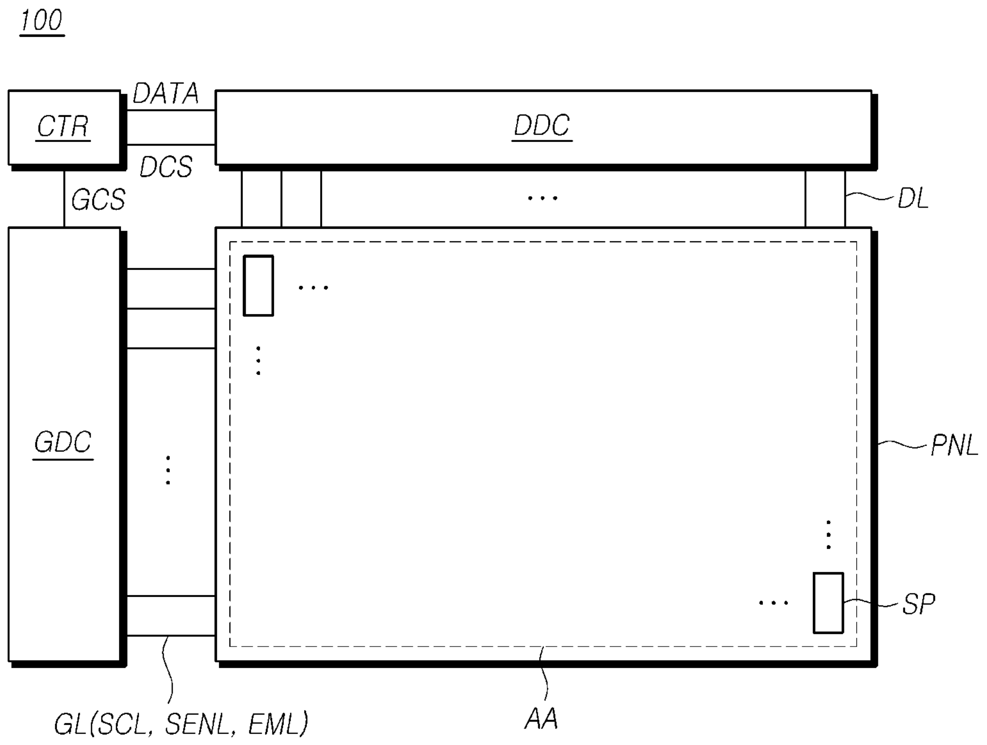
FIG. 1 is a view illustrating a system configuration of a display device according to embodiments of the disclosure.

In the following description of examples or embodiments of the disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the disclosure, detailed descriptions of well-known functions and components incorporated herein will be omitted when it is determined that the description may make the subject matter in some embodiments of the disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the disclosure are described in detail with reference to the accompanying drawings.

FIG. 1 is a view illustrating a system configuration of an organic light emitting display device 100 according to embodiments of the disclosure.

Referring to FIG. 1, an organic light emitting display device 100 according to the present embodiments may include a display panel PNL where a plurality of data lines DL and a plurality of gate lines GL are arranged, and a plurality of subpixels SP connected with the plurality of data lines DL and the plurality of gate lines GL are arranged in an active area A and a driving circuit for driving the display panel PNL.

From a functional point of view, the driving circuit may include a data driving circuit DDC driving the plurality of data lines DL, a gate driving circuit GDC driving the plurality of gate lines GL, and a controller CTR controlling the data driving circuit DDC and the gate driving circuit GDC.

In the display panel PNL, the plurality of data lines DL and the plurality of gate lines GL may be disposed to cross each other. For example, the plurality of data lines DL may be arranged in rows or columns, and the plurality of gate lines GL may be arranged in columns or rows. For ease of description, it is assumed below that the plurality of data lines DL are arranged in rows, and the plurality of gate lines GL are arranged in columns.

The controller CTR supplies various control signals DCS and GCS necessary for the driving operations of the data driving circuit DDC and the gate driving circuit GDC to control the data driving circuit DDC and the gate driving circuit GDC.

The controller CTR starts scanning according to a timing implemented in each frame, converts input image data input from the outside into image data DATA suited for the data signal format used in the data driving circuit DDC, outputs the image data DATA, and controls data driving at an appropriate time suited for scanning.

The controller CTR may be a timing controller used in typical display technology, or a control device that may perform other control functions as well as the functions of the timing controller.

The controller CTR may be implemented as a separate component from the data driving circuit DDC, or the controller CTR, along with the data driving circuit DDC, may be implemented as an integrated circuit.

The data driving circuit DDC receives the image data DATA from the controller CTR and supply data voltage to the plurality of data lines DL, thereby driving the plurality of data lines DL. Here, data driving circuit DDC is also referred to as a 'source driving circuit.'

The data driving circuit DDC may include at least one source driver integrated circuit S-DIC. Each source driver integrated circuit S-DIC may include a shift register, a latch circuit, a digital-to-analog converter DAC, and an output buffer. In some cases, each source driver integrated circuit S-DIC may further include an analog-digital converter ADC.

Each source driver integrated circuit S-DIC may be connected to the bonding pad of the display panel PNL in a tape automated bonding (TAB) or chip-on-glass (COG) scheme or may be directly disposed on the display panel PNL or, in some cases, may be integrated in the display panel PNL. Each source driver integrated circuit S-DIC may also be implemented in a chip-on-film (COF) scheme to be mounted on a source-circuit film connected to the display panel PNL.

The gate driving circuit GDC sequentially drives the plurality of gate lines GL by sequentially supplying scan signals to the plurality of gate lines GL. Here, gate driving circuit GDC is also referred to as a "scan driving circuit."

The gate driving circuit GDC may be connected to the bonding pad of the display panel PNL in a tape automated bonding (TAB) or chip-on-glass (COG) scheme or may be implemented in a gate-in-panel (GIP) type to be directly disposed on the display panel PNL or, in some cases, may be integrated in the display panel PNL. Further, the gate driving circuit GDC may be implemented in a chip-on-film (COF) scheme implemented with a plurality of gate driver integrated circuits G-DIC and mounted on a gate-circuit film connected to the display panel PNL.

The gate driving circuit GDC sequentially supplies scan signals of On voltage or Off voltage to the plurality of gate lines GL under the control of the controller CTR.

When a specific gate line is opened by the gate driving circuit GDC, the data driving circuit DDC converts the image data DATA received from the controller CTR into an analog data voltage and supplies the analog data voltage to the plurality of data lines DL.

The data driving circuit DDC may be positioned on only one side (e.g., the top or bottom side) of the display panel PNL and, in some cases, the data driver DDR may be positioned on each of two opposite sides (e.g., both the top and bottom sides) of the display panel PNL depending on, e.g., driving schemes or panel designs.

The gate driving circuit GDC may be positioned on only one side (e.g., the left or right side) of the display panel PNL and, in some cases, the gate driving circuit GDR may be positioned on each of two opposite sides (e.g., both the left and right sides) of the display panel PNL depending on driving schemes or panel designs, for example.

The plurality of gate lines GL disposed on the display panel PNL may include a plurality of scan lines SCL, a plurality of sense lines SENL, and a plurality of emission control lines EML. The scan line SCL, sense line SENL, and emission control line EML are lines for transferring different types of gate signals (scan signals, sense signals, and emission control signals) to the gate nodes of different types of transistors (scan transistors, sense transistors, and emission control transistors).

Figure 2:
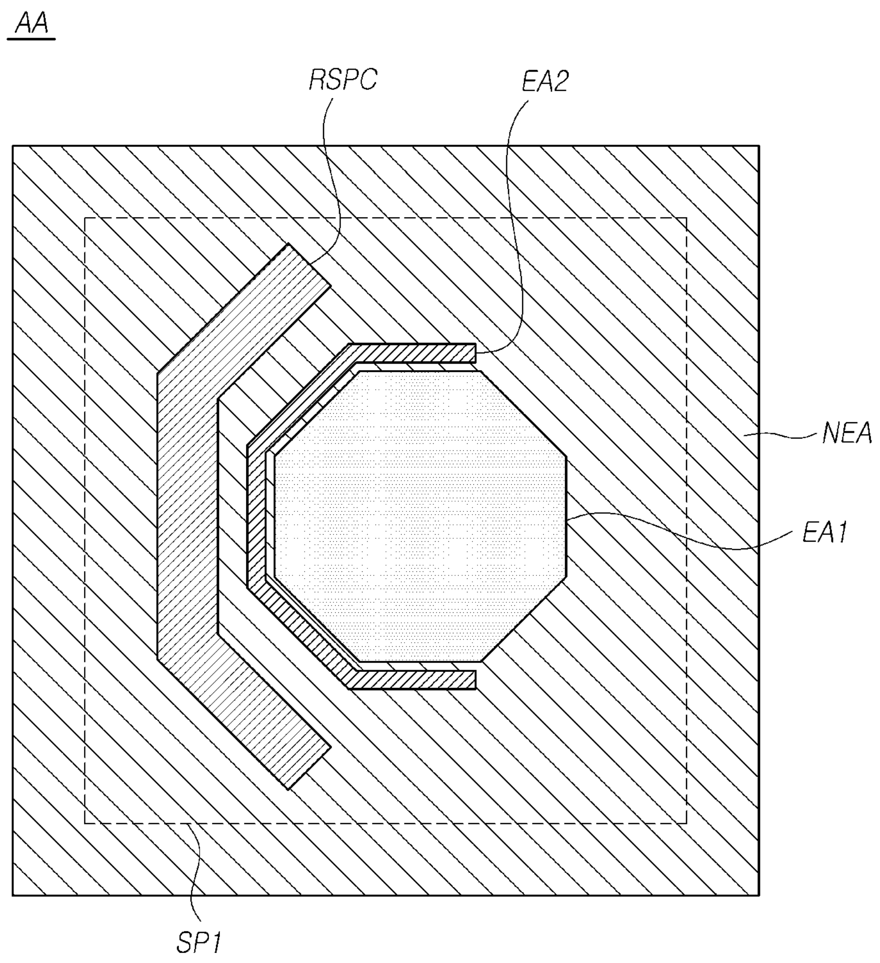
FIG. 2 is a plan view illustrating a display device according to embodiments of the disclosure.

FIG. 2 is a plan view illustrating a display device according to embodiments of the disclosure. More specifically, FIG. 2 is a plan view illustrating a partial area including a first subpixel SP1 in an active area AA of a display device according to embodiments of the disclosure. FIG. 2 illustrates a first light emitting portion EA1 and a second light emitting portion EA2 observed when the light emitting element included in the first subpixel SP1 emits light from a plan view of the display device. Further, for a better understanding, the position of a reverse spacer RSPC, which is not viewable from the plan view of the display device when the light emitting element emits light, is also shown.

Referring to FIG. 2, a display device according to embodiments of the disclosure may include an emission area including a first light emitting portion EA1 and a second light emitting portion EA2 in an active area AA and a non-emission area NEA which is the remaining area except for the emission area. The emission area may refer to all of the emission areas included in the plurality of subpixels positioned in the active area AA, and the non-emission area NEA may refer to the remaining areas except for the emission area in the active area AA.

The first light emitting portion EA1 may be positioned in the first subpixel SP1. The second light emitting portion EA2 may be positioned in the first subpixel SP1. The first light emitting portion EA1 may be a main emission area of the first subpixel SP1, and the second light emitting portion EA2 may be an auxiliary emission area of the first subpixel SP1.

The second light emitting portion EA2 may be positioned to surround a portion of the first light emitting portion EA1. That the second light emitting portion EA2 is positioned to surround a portion of the first light emitting portion EA1 may mean that the second light emitting portion EA2 is positioned around the first light emitting portion EA1 to surround the first light emitting portion EA1 with a partial area open, rather than surrounding the first light emitting portion EA1 in a closed loop shape, as illustrated in FIG. 2. That is, the second light emitting portion EA2 partially surrounds the perimeter of the first light emitting portion EA1 without surrounding an entirety of the perimeter of the first light emitting portion in a plan view of the display device. As the second light emitting portion EA2 is positioned to surround a portion of the perimeter of the first light emitting portion EA1, the display device may have excellent display quality at a specific viewing angle.

Both the first light emitting portion EA1 and the second light emitting portion EA2 may be positioned in the first subpixel SP1. Accordingly, the first light emitting portion EA1 and the second light emitting portion EA2 may be areas in which light generated by the same light emitting element constituting the first subpixel SP1 is emitted.

The first light emitting portion EA1 and the second light emitting portion EA2 may emit light of different wavelengths. For example, the first light emitting portion EA1 emits first light of a first wavelength and the second light emitting portion EA2 emits second light of a second wavelength that is different from the first wavelength. While the first light emitting portion EA1 and the second light emitting portion EA2 are areas in which light generated by the same light emitting element constituting the first subpixel SP1 is emitted, the first light emitting portion EA1 and the second light emitting portion EA2 may emit light of different wavelengths. This is because the light emitted from the first light emitting portion EA1 and the light emitted from the second light emitting portion EA2 pass through different optical paths and are emitted to the outside of the display device. For example, the light emitted from the first light emitting portion EA1 may be light generated by the light emitting layer of the light emitting element and emitted to the outside of the display device without being reflected by the reflector to be described below (e.g., a first path), and the light emitted from the second light emitting portion EA2 may be light generated by the light emitting layer of the light emitting element and reflected by the reflector to be described below (e.g., a second path) and then emitted to the outside of the display device. Since the light emitted from the first light emitting portion EA1 and the light emitted from the second light emitting portion EA2 are emitted to the outside of the display device through different optical paths, the first light emitting portion EA1 and the second light emitting portion EA2 may emit light of different wavelengths.

The reverse spacer RSPC may be positioned in the non-emission area NEA. The reverse spacer RSPC may be positioned to surround a portion of the second light emitting portion EA2. That the reverse spacer RSPC is positioned to surround a portion of the second light emitting portion EA2 may mean that the reverse spacer RSPC is positioned around the second light emitting portion EA2 to surround the second light emitting portion EA2 with a partial area open, rather than surrounding the second light emitting portion EA2 in a closed loop shape, as illustrated in FIG. 2. That is, the reverse spacer RSPC partially surrounds the perimeter of the second light emitting portion EA2 without surrounding an entirety of the perimeter of the second light emitting portion EA2 in the plan view of the display device. As the reverse spacer RSPC is positioned to surround a portion of the second light emitting portion EA2, the display device may have excellent display quality at a specific viewing angle.

The first light emitting portion EA1 may be positioned in an opening of the subpixel SP, and the second light emitting portion EA2 may be positioned in a non-opening portion of the subpixel SP. The opening is an area defined by a bank to be described below, and may mean a hole in the bank. The non-opening portion may mean the remaining area except for the hole of the bank in the area in which the bank is formed.

The display device according to embodiments of the disclosure may include a folding axis about which the display device is configured to fold.

Figure 3:
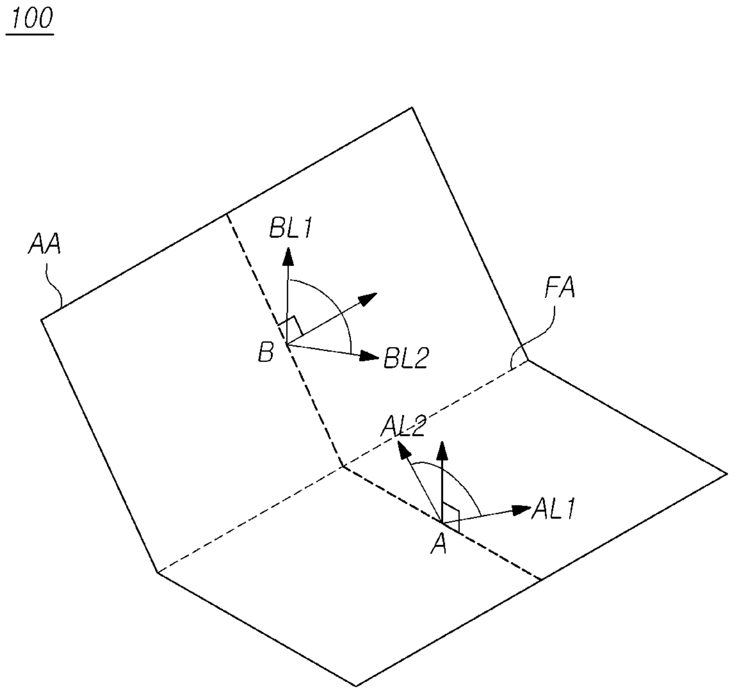
FIG. 3 is a view schematically illustrating a display device according to embodiments of the disclosure.

FIG. 3 is a view schematically illustrating a display device according to embodiments of the disclosure.

Referring to FIG. 3, the display device 100 may include a folding axis FA. In other words, the display device 100 may be a foldable display device that may be folded on the folding axis FA. The folding axis FA may be positioned at any position in the active area AA.

A plurality of subpixels may be positioned in the active area AA. For example, subpixel A and subpixel B positioned on the opposite side of the folding axis may be positioned.

Light emitted from subpixels A and B is emitted in a specific viewing angle range. When a direction parallel to the folding axis FA is referred to as a first direction and a direction orthogonal to the folding axis FA is referred to as a second direction, subpixel A may emit light in a viewing angle range of the first light AL1 to the second light AL2 in the second direction. Subpixel B may emit light in a viewing angle range of the first light BL1 to the second light BL2 in the second direction. Subpixels included in the display device may require specific viewing angle characteristics depending on the display device.

Figure 4:
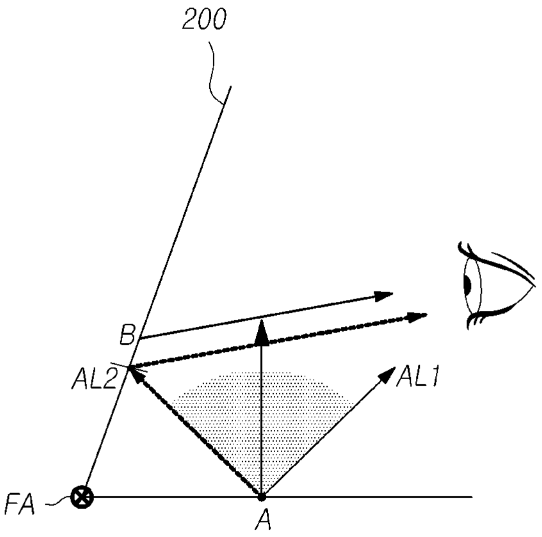
FIG. 4 is a view illustrating an example in which a user uses a display device according to a comparative example of the disclosure, at a specific viewing angle.

FIG. 4 is a view illustrating that a user uses a display device 200 according to a comparative example of the disclosure at a specific viewing angle.

Referring to FIG. 4, light AL1 emitted from subpixel A in a direction opposite to the folding axis FA may reach the user. However, the light AL2 emitted from subpixel A toward the folding axis FA is reflected by the display device 200 and reaches the user. Since the light AL2 reaches the user together with the light emitted from subpixel B, the user may have a problem in recognizing the light emitted from subpixel B.

Figure 5:
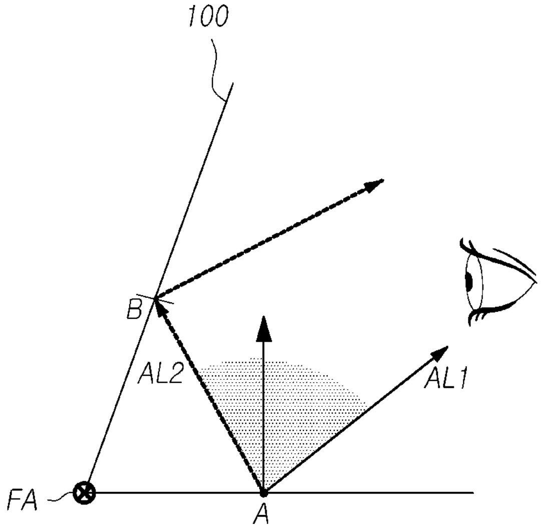
FIG. 5 is a view illustrating an example in which a user uses a display device according to an embodiment of the disclosure, at a specific viewing angle.

FIG. 5 is a view illustrating that a user uses a display device according to embodiments of the disclosure at a specific viewing angle.

Referring to FIG. 5, light AL1 emitted from subpixel A in a direction opposite to the folding axis FA may reach the user. Further, the light AL2 emitted from subpixel A toward the folding axis FA does not reach the user even when reflected from the display device 100. Since the light AL2 does not reach the user even when the light AL2 is reflected from the display device 100, there is no problem for the user to recognize the light emitted from subpixel B.

As described with reference to FIGS. 4 and 5, the display device may be required to have specific characteristics with respect to a specific viewing angle. For example, when the display device is a foldable display device and the subpixel has a limited viewing angle in a specific direction, the user may use the display device more easily as illustrated in FIG. 5. More specifically, when the subpixel has a limited viewing angle in the folding axis FA direction, the display quality of the display device may be further enhanced. The display device according to embodiments of the disclosure may include subpixels having a smaller viewing angle in the direction of the folding axis FA and a larger viewing angle in the direction opposite to the folding axis FA.

Figure 6:
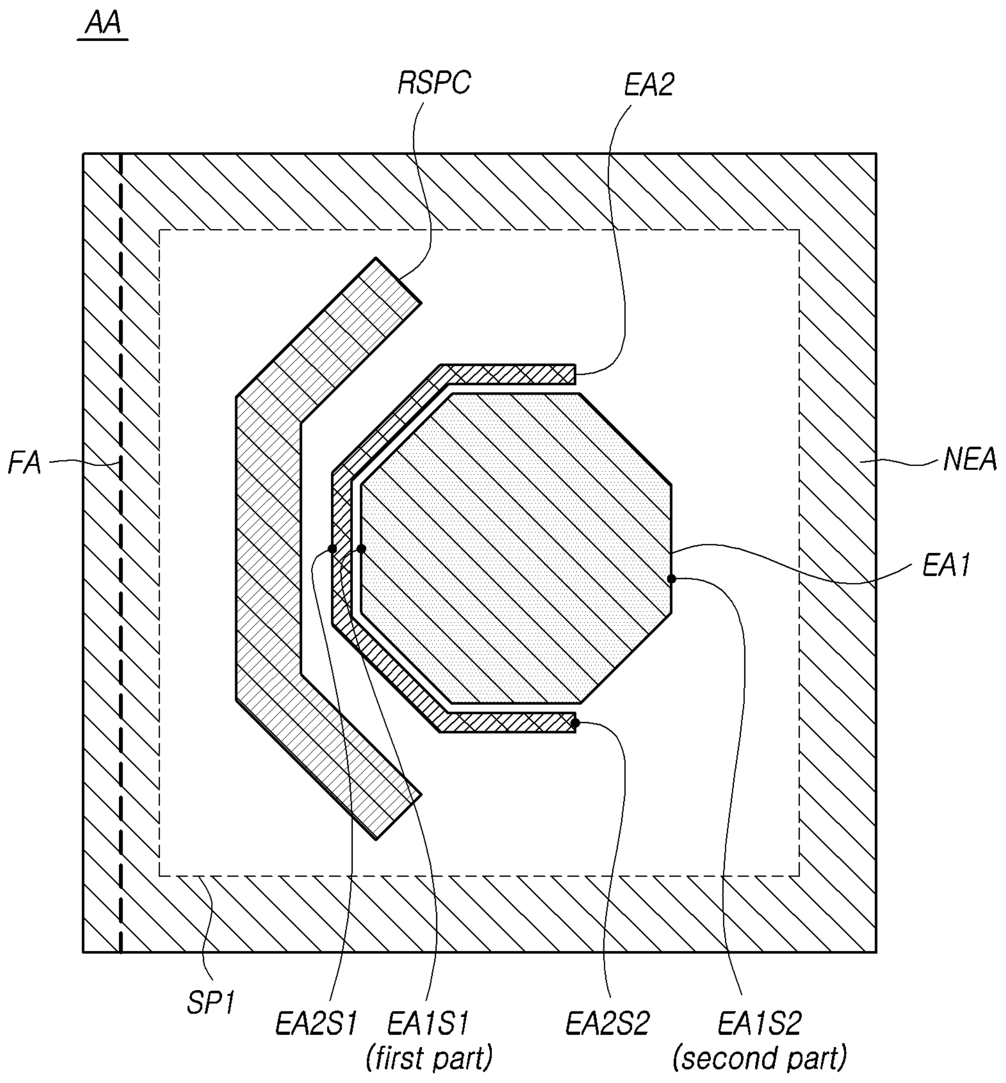
FIG. 6 is a plan view illustrating a display device according to embodiments of the disclosure.

FIG. 6 is a plan view illustrating a display device according to embodiments of the disclosure. More specifically, FIG. 6 is a plan view of a partial area including a first subpixel SP1 in an active area AA of a display device according to embodiments of the disclosure. FIG. 6 illustrates a first light emitting portion EA1 and a second light emitting portion EA2 observed when a light emitting element included in a first subpixel SP1 emits light. Further, for a better understanding, the position of a reverse spacer RSPC, which is not viewable from the plan view of the display device when the light emitting element emits light, is also shown.

Referring to FIG. 6, a display device according to embodiments of the disclosure may include a folding axis FA. The folding axis FA may be positioned in the active area AA of the display device.

The second light emitting portion EA2 may be positioned between the first light emitting portion EA1 and the folding axis FA. As the second light emitting portion EA2 is positioned between the first light emitting portion EA1 and the folding axis FA, the first subpixel SP1 may have a wider viewing angle in a direction opposite to the folding axis FA and a smaller viewing angle in the folding axis FA direction. As a result, it is possible to prevent such an occasion as shown in FIG. 4 in which light emitted from the subpixel SP1 toward the folding axis FA is reflected from the display device and recognized by the user when the display device is used, folded around the folding axis FA.

The first light emitting portion EA1 may include a plurality of points such as a first point EA1S1 and a second point EA1S2. The first point EA1S1 may mean a portion of the first light emitting portion EA1 that is closest to the folding axis FA amongst the plurality of points. The second point EA1S2 may mean a portion of the first light emitting portion EA1 that is farthest from the folding axis FA amongst the plurality of points.

The second light emitting portion EA2 may be positioned so as not to surround the second point EA1S2 of the first light emitting portion EA1 while surrounding (e.g., overlapping) the first point EA1S1 of the first light emitting portion EA1 in the plan view of the display device. When the second light emitting portion EA2 is positioned to surround (e.g., overlap) the first point EA1S1 of the first light emitting portion EA1 and not to surround (e.g., overlap) the second point EA1S2 of the first light emitting portion EA1 in the plan view of the display device, the first subpixel SP1 may have a smaller viewing angle from the center of the first light emitting portion EA1 toward the first point EA1S1, and thus the display device may have a limited viewing angle in the direction of the folding axis FA.

The reverse spacer RSPC may be positioned between the second light emitting portion EA2 and the folding axis FA.

Since the reverse spacer RSPC is positioned between the second light emitting portion EA2 and the folding axis FA, the reverse spacer RSPC may block light emitted from the first light emitting portion EA1 and the second light emitting portion EA2 and directed toward the folding axis FA. Therefore, as illustrated in FIG. 4, it is possible to prevent light emitted from the first subpixel SP1 from being reflected by the display device and recognized by the user.

The second light emitting portion EA2 may include a plurality of points comprising a first point EA2S1 and a second point EA2S2. The first point EA2S1 may mean a portion of the second light emitting portion EA2 that is closest to the folding axis FA amongst the plurality of points. The second point EA2S2 may mean a portion of the second light emitting portion EA2 that is farthest from the folding axis FA amongst the plurality of points. The second point EA2S2 is closer to the second point EA1S2 of the first light emitting portion EA1 than the first point EA1S1 of the first light emitting portion EA1.

The reverse spacer RSPC may surround (e.g., overlap) the first point EA2S1 of the second light emitting portion EA2 and may be positioned not to surround (e.g., non-overlapping) the second point EA2S2 of the second light emitting portion EA2. When the reverse spacer RSPC is positioned so as not to surround the second point EA2S2 of the second light emitting portion EA2 while surrounding the first point EA2S1 of the second light emitting portion EA2, the reverse spacer RSPC may block the light emitted from the first light emitting portion EA1 and the second light emitting portion EA2 and directed toward the folding axis FA. Accordingly, the display device may have a limited viewing angle in the direction of the folding axis FA.

Figure 7:
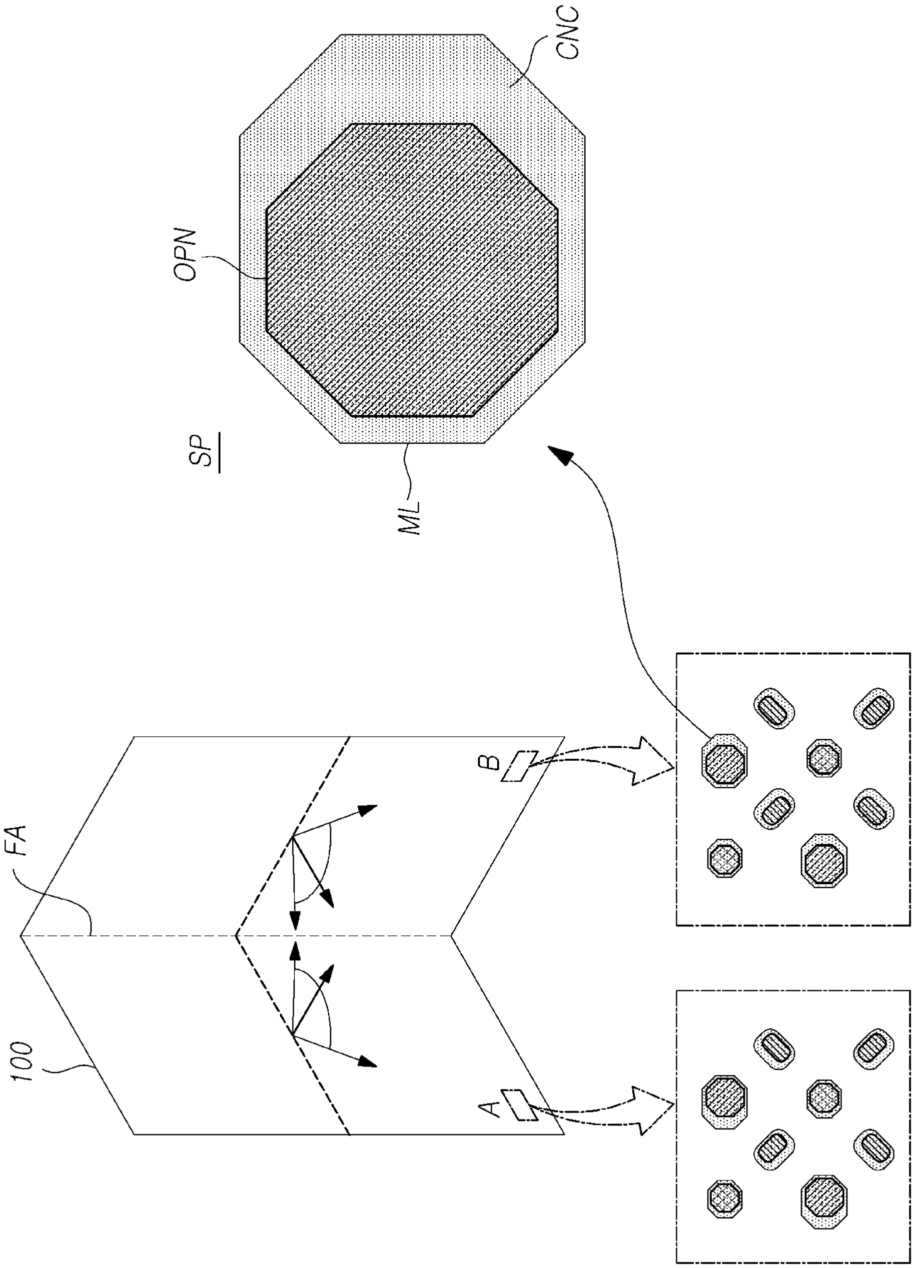
FIG. 7 is a view illustrating a display device according to embodiments of the disclosure.

FIG. 7 is a view illustrating a display device according to embodiments of the disclosure. More specifically, FIG. 7 schematically illustrates a structure of each subpixel according to a positional relationship with the folding axis FA in the display device 100 including the folding axis FA according to embodiments of the disclosure, and is an enlarged view of the display device and a partial area thereof at a different magnification.

Referring to FIG. 7, the display device 100 may include a folding axis FA. Subpixels may have different structures in area A and area B positioned in areas symmetrical with respect to the folding axis FA. For example, the subpixel SP of area A and area B may include an opening OPN, a concave portion CNC, and a reflector ML. The opening OPN may be an opening of a bank to be described below. The concave portion CNC is a concave portion included in a planarization layer to be described below, and may mean a structure in which a light emitting element is positioned in a flat central portion and an inclined portion is positioned at the periphery. The reflector ML is a portion where a first electrode to be described below is positioned on the inclined portion, and may refer to a structure capable of reflecting light emitted from the light emitting element.

As illustrated in FIG. 7, the opening OPN is not positioned in the center of the concave portion CNC. The opening OPN may be positioned in the concave portion CNC but may be positioned closer to the folding axis FA. When the opening OPN is positioned in the concave portion CNC but closer to the folding axis FA, the opening OPN may be positioned closer to the reflector ML positioned at the periphery of the concave portion CNC on a side close to the folding axis FA. When the reflector ML is positioned closer to the opening OPN, the viewing angle in the corresponding direction is limited, and thus the display device 100 may have a limited viewing angle with respect to the folding axis FA direction.

As the opening OPN is positioned closer to the folding axis FA in the concave portion CNC in the subpixels SP positioned in area A, and the opening OPN is positioned closer to the folding axis FA in the concave portion CNC in the subpixels SP positioned in area B as illustrated in FIG. 7, the subpixels SP may have different structures depending on the position with respect to the folding axis FA.

Figure 8:
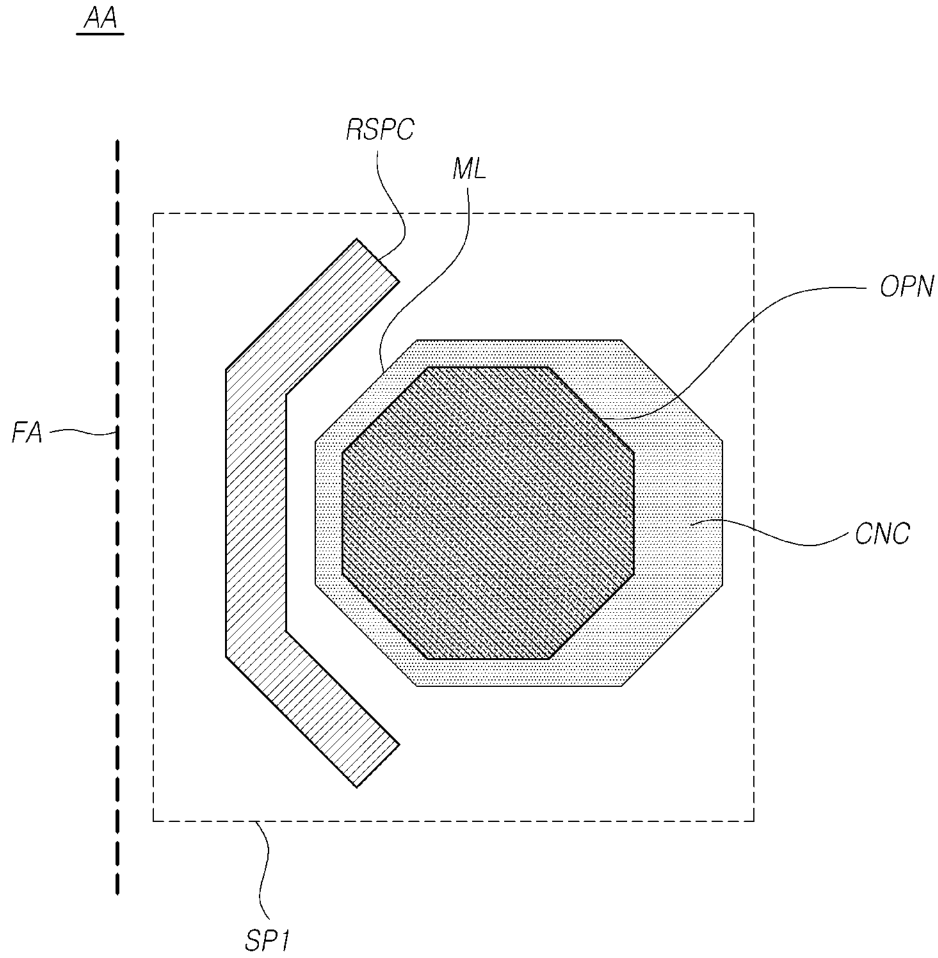
FIG. 8 is a plan view illustrating a display device according to embodiments of the disclosure.

FIG. 8 is a plan view illustrating a display device according to embodiments of the disclosure. More specifically, FIG. 8 is a plan view of a portion of an active area of a display device according to embodiments of the disclosure.

Referring to FIG. 8, the opening OPN may be positioned in the concave portion CNC, but may be positioned closer to the folding axis FA. The reflector ML may be positioned at the periphery of the concave portion CNC. Matters regarding the folding axis FA, the opening OPN, the concave portion CNC, and the reflector ML are the same as those described above with reference to FIG. 7.

The reverse spacer RSPC may be positioned to surround a portion of the concave portion CNC. Further, the reverse spacer RPSC may be positioned closer to the folding axis FA than the concave portion CNC. Since the reverse spacer RPSC is positioned to surround a portion of the concave portion CNC including the reflector ML at the outer periphery but is positioned closer to the folding axis FA than the concave portion CNC, the reverse spacer RSPC may effectively block a portion of light emitted from the opening OPN of the subpixel SP and directed toward the folding axis FA.

The specific position, size, and height of the reverse spacer RSPC may be selected in consideration of how effectively the reverse spacer RSPC may block light directed toward the folding axis FA among the light emitted from the subpixel.

Figure 9:
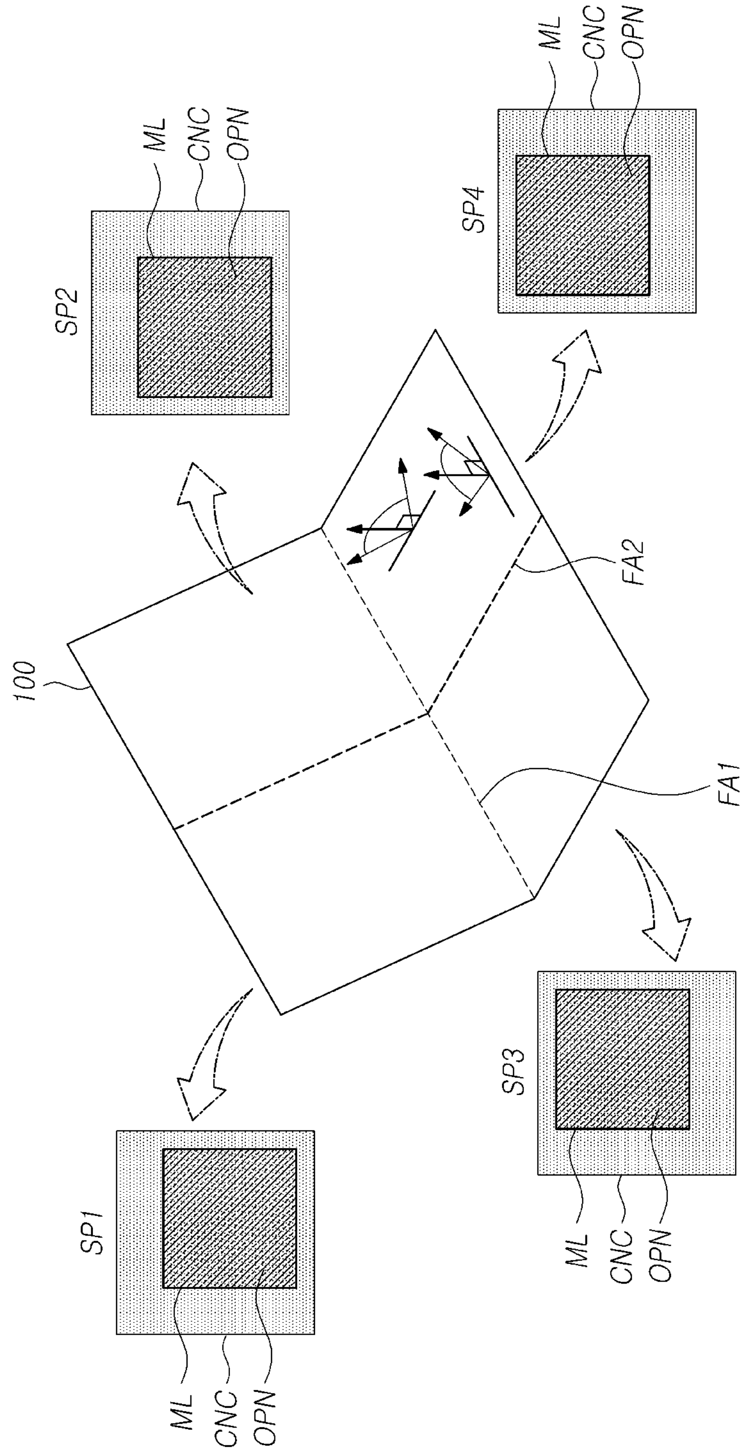
FIG. 9 is a view illustrating a display device according to embodiments of the disclosure.

FIG. 9 is a view illustrating a display device according to embodiments of the disclosure. Referring to FIG. 9, the display device 100 may include a first folding axis FA1 and a second folding axis FA2.

Each of the plurality of subpixels included in the display device 100 may have a different structure according to a positional relationship with the folding axis.

For example, in the first subpixel SP1, the opening OPN may be positioned in the concave portion CNC, but the opening OPN may not be positioned in the central portion of the concave portion CNC and may be positioned closer to the first folding axis FA1 and the second folding axis FA2. In the second to fourth subpixels SP2 to SP4, like the first subpixel SP1, the opening OPN may be positioned in the concave portion CNC, but may be positioned closer to the first folding axis FA1 and the second folding axis FA2. As described above, when the openings OPN of the subpixels SP1, SP2, SP3, and SP4 are positioned in the concave portion CNC in each area symmetrically positioned with respect to the folding axes FA1 and FA2 and are positioned closer to the folding axes FA1 and FA2, the light emitted from the subpixels SP1, SP2, SP3, and SP4 is reflected by the reflector ML and thus the subpixels SP1, SP2, SP3, and SP4 have a limited viewing angle in the direction of the folding axes FA1 and FA2. Therefore, it is possible to prevent deterioration of display quality due to reflection, by the display device, of the light emitted from the subpixels SP1, SP2, SP3, and SP4 to the folding axes FA1 and FA2.

Figure 10:
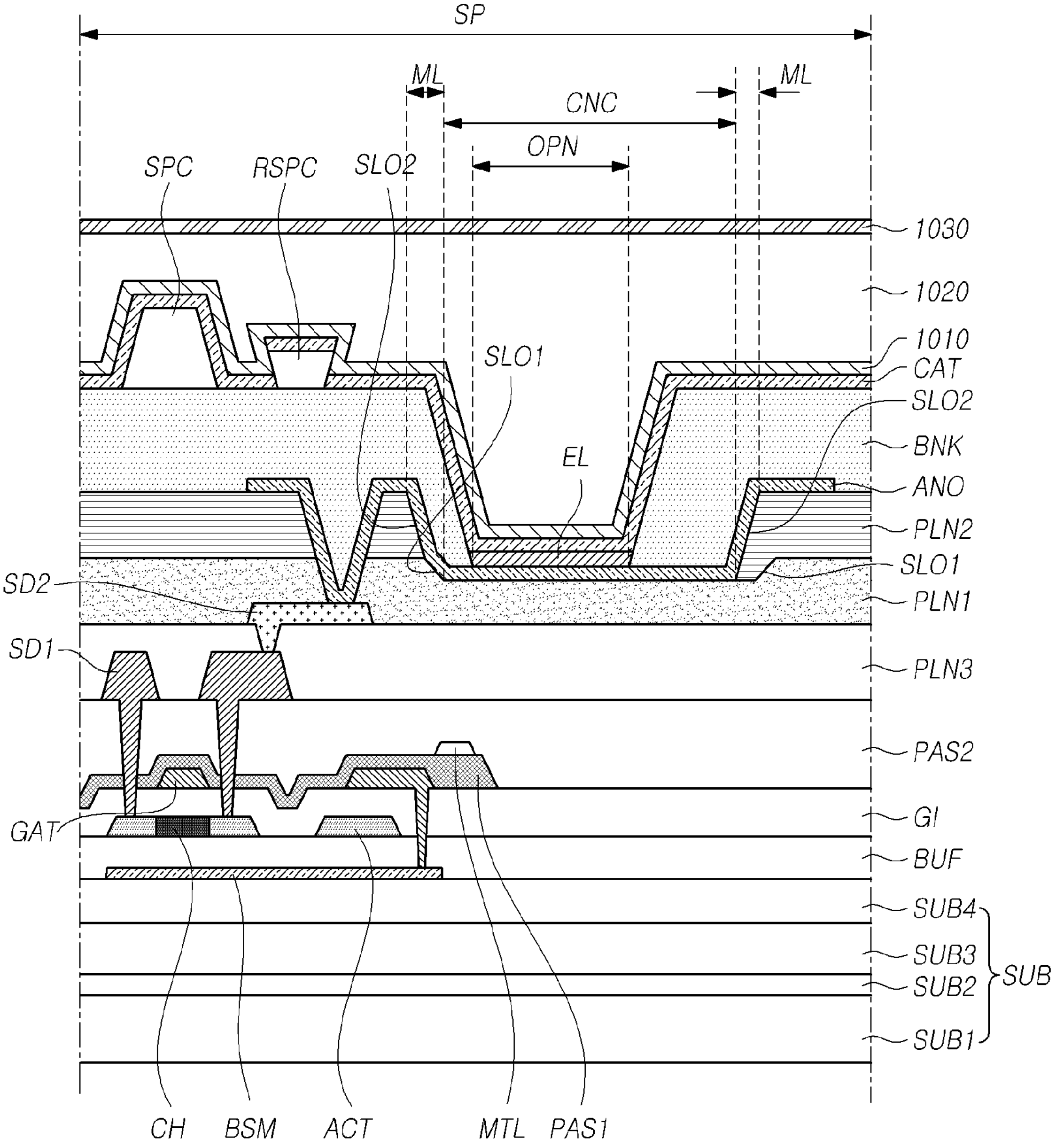
FIG. 10 is a cross-sectional view illustrating a display device according to embodiments of the disclosure.

FIG. 10 is a cross-sectional view illustrating a display device according to embodiments of the disclosure. Referring to FIG. 10, a display device 100 may include a substrate SUB including a subpixel SP, a first planarization layer PLN1 positioned on the substrate SUB, a second planarization layer PLN2 positioned on the first planarization layer PLN1, a first electrode ANO positioned on the second planarization layer PLN2, a light emitting layer EL positioned on the first electrode ANO, a bank BNK positioned on the first electrode ANO, a reflector ML, and a second electrode CAT. The substrate SUB may be, e.g., a thin film transistor array substrate on which the thin film transistor array for driving the light emitting element included in the display device 100 is positioned. The substrate SUB may have a multilayer structure including a plurality of layers. For example, the substrate SUB may include a first substrate SUB, a second substrate SUB, a third substrate SUB, and a fourth substrate SUB. The substrate SUB may be a glass substrate or a plastic substrate. Alternatively, the substrate SUB may have a multilayer structure including a polymer film and an inorganic film. For example, the first substrate SUB1 and the third substrate SUB3 may be polyimide films, and the second substrate SUB2 and the fourth substrate SUB4 may be inorganic films.

A lower protective metal BSM may be positioned on the substrate SUB. The lower protective metal BSM may be positioned to overlap the transistor positioned on the substrate SUB.

A buffer layer BUF may be positioned on the substrate SUB and the lower protective metal BSM. An active material layer ACT may be positioned on the buffer layer BUF. The active material layer ACT may constitute an active layer of the transistor. The active material layer ACT constituting the transistor may include a channel area CH positioned between the source-drain electrodes.

The gate insulation film GI may be positioned on the active material layer ACT. A gate electrode material layer GAT may be positioned on the gate insulation film GI. The gate electrode material layer GAT may constitute the gate electrode constituting the transistor.

A first passivation layer PAS1 may be positioned on the gate electrode material layer GAT. A metal layer MTL may be positioned on the first passivation layer PAS1.

A second passivation layer PAS2 may be positioned on the metal layer MTL. A first source-drain electrode material layer SD1 may be positioned on the second passivation layer PAS2. The first source-drain electrode material layer SD1 may be electrically connected to the active material layer ACT constituting the transistor through a contact hole.

A third planarization layer PLN3 may be positioned on the first source-drain electrode material layer SD1. A second source-drain electrode material layer SD2 may be positioned on the third planarization layer PLN3.

The first planarization layer PLN1 may be positioned on the second source-drain electrode material layer SD2 and the third planarization layer PLN3. The first planarization layer PLN1 may include a concave portion CNC. The concave portion CNC is a portion having a concave shape (e.g., a recess) in the direction of the substrate SUB and may refer to a portion in which an electrode constituting a light emitting element and a light emitting layer are positioned.

The first planarization layer PLN1 may include an inclined surface SLO1 that extends away from the substrate SUB. The inclined surface SLO1 of the first planarization layer PLN1 may be connected to the concave portion CNC. The concave portion CNC and the inclined surface SLO1 of the first planarization layer PLN1 may be formed by a patterning process using a halftone mask.

The second planarization layer PLN2 may be positioned on the first planarization layer PLN1. The second planarization layer PLN2 may include an inclined surface SLO2 that extends away from the substrate SUB. The inclined surface SLO2 of the second planarization layer PLN2 may be an inclined surface SLO2 constituting the reflector ML. The inclined surface SLO2 of the second planarization layer PLN2 may be positioned to surround the concave portion CNC. The inclined surface SLO2 of the second planarization layer PLN2 may be formed by a patterning process using a full tone mask.

In an example in which the first planarization layer PLN1 and the second planarization layer PLN2 include an inclined surface, the inclined surface SLO1 of the first planarization layer PLN1 may be referred to as a first inclined surface and the inclined surface SLO2 of the second planarization layer PLN2 may be referred to as a second inclined surface to distinguish the inclined surface SLO1 of the first planarization layer PLN1 from the inclined surface SLO2 of the second planarization layer PLN2. The second inclined surface SLO2 may have a larger angle with respect to the substrate SUB than the first inclined surface SLO1. In other words, the second inclined surface SLO2 may have a steeper inclination than the first inclined surface SLO1. As shown in FIG. 2, a first portion of second planarization layer PLN2 is in the concave portion CNC whereas a second portion of the second planarization layer PLN2 is not in the concave portion CNC.

A first electrode ANO may be positioned on the second planarization layer PLN2. The first electrode ANO may be an electrode constituting a light emitting element included in the display device 100. The first electrode ANO may be an anode electrode or a cathode electrode as an electrode constituting a light emitting element that is a light emitting diode. The second electrode CAT may be the cathode electrode or the anode electrode as an electrode constituting the light emitting element that is the light emitting diode.

The first electrode ANO may be positioned on the first planarization layer PLN1 and the second planarization layer PLN2. For example, the first electrode ANO may be positioned on the first planarization layer PLN1 in the concave portion CNC, and the first electrode ANO may be positioned on the second planarization layer PLN2 in the reflector ML.

The first electrode ANO may be composed of multiple layers or a single layer. The first electrode ANO may be a reflective electrode. When the first electrode ANO is a reflective electrode, e.g., the first electrode ANO may have a multilayer structure including at least one reflective layer.

The reflector ML may refer to a portion of the first electrode ANO capable of reflecting light emitted from the light emitting layer EL. The reflector ML may include a portion of the first electrode ANO positioned on an inclined surface of at least one of the first planarization layer PLN1 and the second planarization layer PLN2. In this example, the first electrode ANO may be a reflective electrode. For example, the reflector ML may include a portion of the first electrode ANO positioned on the first inclined surface SLO1 of the first planarization layer PLN1 and a second inclined surface SLO2 of the second planarization layer PLN2 that is connected to the first inclined surface SLO1, and may include a first electrode ANO positioned on the second inclined surface SLO2 of the second planarization layer PLN2.

The bank BNK may be positioned on the first electrode ANO and the second planarization layer PLN2. The bank BNK may be a layer defining the emission area of the display device. The bank BNK may include an opening OPN in the concave portion CNC of the first planarization layer PLN1. The first electrode ANO may be exposed by the opening OPN of the bank BNK, and the light emitting layer EL may be positioned on the exposed first electrode ANO. The first emission area may be defined by the opening OPN included in the bank BNK.

The reverse spacer RSPC may be positioned on the bank BNK. The reverse spacer RSPC may refer to a spacer having an inverted tapered shape whose thickness increases in a direction away from the substrate SUB. The reverse spacer RSPC may be positioned closer to the folding axis while being positioned adjacent to the reflector ML. As the reverse spacer RSPC is positioned as described above, the reverse spacer RSPC may block a portion of the light emitted from the light emitting layer EL and directed to the folding axis from traveling toward the folding axis.

The spacer SPC may be positioned on the bank BNK. The spacer SPC may have a tapered shape whose thickness decreases in a direction away from the substrate SUB.

The second electrode CAT may be disposed on the bank BNK, the spacer SPC, and the reverse spacer RSPC. In the opening OPN of the bank BNK, the second electrode CAT may be disposed on the light emitting layer EL. In the opening OPN of the bank BNK, In the opening OPN of the bank BNK, a portion where the first electrode ANO, the light emitting layer EL, and the second electrode CAT overlap may constitute the light emitting element (e.g., organic light-emitting diode, inorganic light-emitting diode, etc.)).

Referring to FIG. 10, the second electrode CAT may be disconnected at the lower end of the reverse spacer RSPC.

Referring to FIG. 10, the display device 100 may further include an encapsulation layer on the second electrode CAT. The encapsulation layer may prevent the light emitting element from being exposed to moisture or oxygen. For example, the encapsulation layer may include a first encapsulation layer 1010 on the second electrode CAT, a second encapsulation layer 1020 on the first encapsulation layer 1010, and a third encapsulation layer 1030 on the second encapsulation layer 1020. For example, the first encapsulation layer 1010 and the third encapsulation layer 1030 may be an inorganic film, and the second encapsulation layer 1020 may be an organic film.

Referring to FIG. 10, peeling of the organic film constituting the light emitting element or the encapsulation layer on the light emitting element can be prevented by the reverse spacer RSPC.

Figure 11:
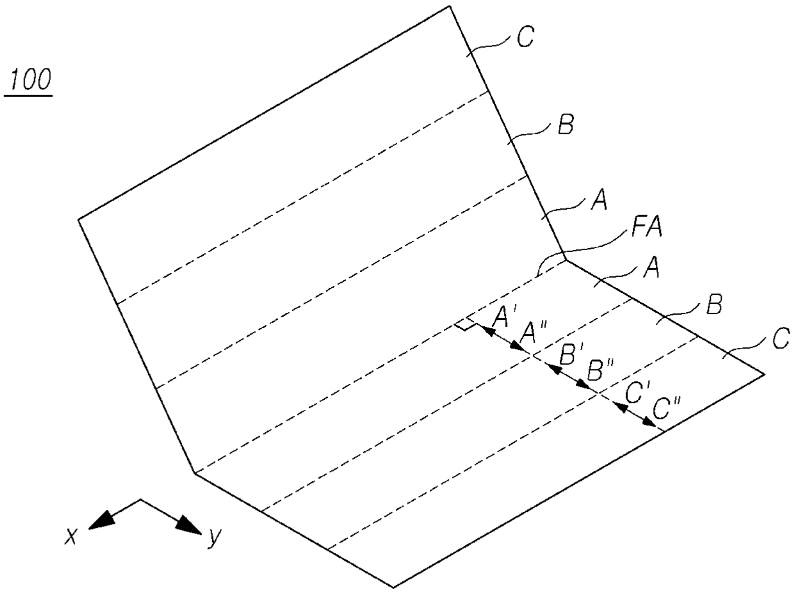
FIG. 11 is a view illustrating a display device according to embodiments of the disclosure.

FIG. 11 is a view illustrating a display device according to various embodiments of the disclosure. More specifically, FIG. 11 is a view schematically illustrating a display device 100 including a folding axis FA in a display device 100 according to embodiments of the disclosure.

Referring to FIG. 11, the display device 100 according to embodiments of the disclosure may be divided into arbitrary areas according to the distance from the folding axis FA. For example, with respect to the folding axis FA positioned parallel to the first direction (x-axis), a closest area A, an intermediate area B, and a farthest area C may be included depending on the distance between the folding axis FA and the second direction (y-axis) orthogonal to the first direction. The display device 100 may include subpixels having different structures depending on the distance from the folding axis FA. The display device 100 may have a structure to have a limited viewing angle toward the folding axis FA as the subpixel is positioned closer to the folding axis FA.

Figure 12:
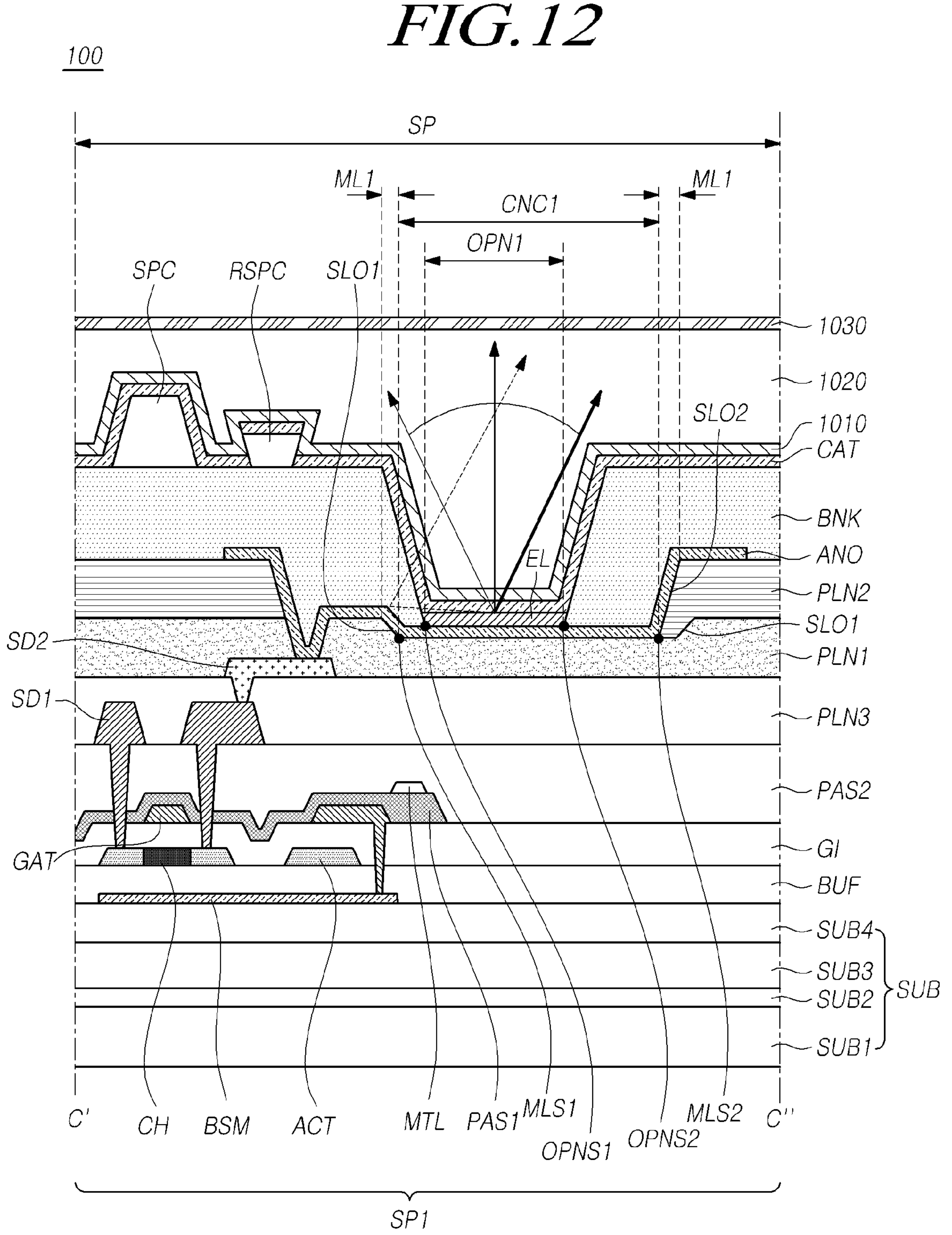
FIGS. 12, 13, and 14 are cross-sectional views illustrating a display device according to embodiments of the disclosure.

FIG. 12 is a cross-sectional view illustrating a display device according to embodiments of the disclosure. More specifically, in the display device 100 illustrated in FIG. 11, it is a cross-sectional view (C'-C') of a subpixel positioned in area C. In the following description, description of the same content as the structure of FIG. 10 is omitted.

In describing the display device illustrated in FIG. 12, what is not particularly described otherwise is the same as that described above with reference to FIG. 10.

Referring to FIG. 12, the first planarization layer PLN1 may include a concave portion CNC1. The first planarization layer PLN1 may include an inclined surface SLO1. The concave portion CNC1 and the inclined surface SLO1 of the first planarization layer PLN1 may be formed by a patterning process using a halftone mask.

The opening OPN1 may be positioned in the concave portion CNC1 of the first planarization layer PLN1. Since the opening OPN1 is positioned in the concave portion CNC1 of the first planarization layer PLN1, a portion of the light emitted from the light emitting layer EL positioned in the opening OPN1 may be emitted toward the reflector ML1.

The second planarization layer PLN2 may include an inclined surface SLO2. In an example in which the first planarization layer PLN1 and the second planarization layer PLN2 include an inclined surface, the inclined surface SLO1 of the first planarization layer PLN1 may be referred to as a first inclined surface and the inclined surface SLO2 of the second planarization layer PLN2 may be referred to as a second inclined surface to distinguish the inclined surface SLO1 of the first planarization layer PLN1 from the inclined surface SLO2 of the second planarization layer PLN2. The second inclined surface SLO2 may have a larger angle with respect to the substrate SUB than the first inclined surface SLO1. In other words, the second inclined surface SLO2 may have a steeper inclination than the first inclined surface SLO1.

The second inclined surface SLO2 may be positioned closer to the light emitting layer EL than the first inclined surface SLO1, but may be positioned at a portion farther from the folding axis FA than the inclined surface SLO1 of the first planarization layer PLN1, and the first inclined surface SLO1 of the first planarization layer PLN1 may be positioned at a portion closer to the folding axis FA in the inclined surface SLO1 of the first planarization layer PLN1 than the second inclined surface SLO2. In other words, the second inclined surface SLO2 may be positioned to surround the opening OPN1, but may not surround the first point OPNS1 closest to the folding axis in the opening OPN1 while surrounding the second point OPNS2 closest to the folding axis.

The reflector ML1 may include the first electrode ANO positioned on the inclined surface SLO1 of the first planarization layer PLN1 at a portion closer to the folding axis FA than the inclined surface SLO2, and may include the first electrode ANO positioned on the inclined surface SLO2 of the second planarization layer PLN2 at a portion farther from the folding axis FA. In other words, the reflector ML1 close to the folding axis FA may include the first electrode ANO positioned on the inclined surface SLO1 having a smaller angle with respect to the substrate, and the reflector ML1 not close to the folding axis FA may include the first electrode ANO positioned on the inclined surface SLO2 having a larger angle with respect to the substrate.

The reflector ML1 may include a first point MLS1 closest to the folding axis FA and a second point MLS2 farthest from the folding axis FA. The distance between the first point MLS1 of the reflector ML1 and the opening OPN may be shorter than the distance between the second point MLS2 of the reflector ML1 and the opening OPN1. When the reflector ML positioned close to the folding axis FA is positioned closer to the opening OPN1, light directed to the folding axis FA among the light emitted from the light emitting layer EL positioned in the opening OPN1 may be more effectively reflected from the reflector ML1, so that a limited viewing angle may be provided in the direction of the folding axis FA.

The subpixel illustrated in FIG. 12 may be referred to as a first subpixel SP1, the opening OPN1 may be referred to as a first opening OPN1, and the reflector ML1 may be referred to as a first reflector ML1. The first opening OPN1 may be positioned in the first subpixel SP1, and the first reflector ML1 may be positioned in the first subpixel.

Figure 13:
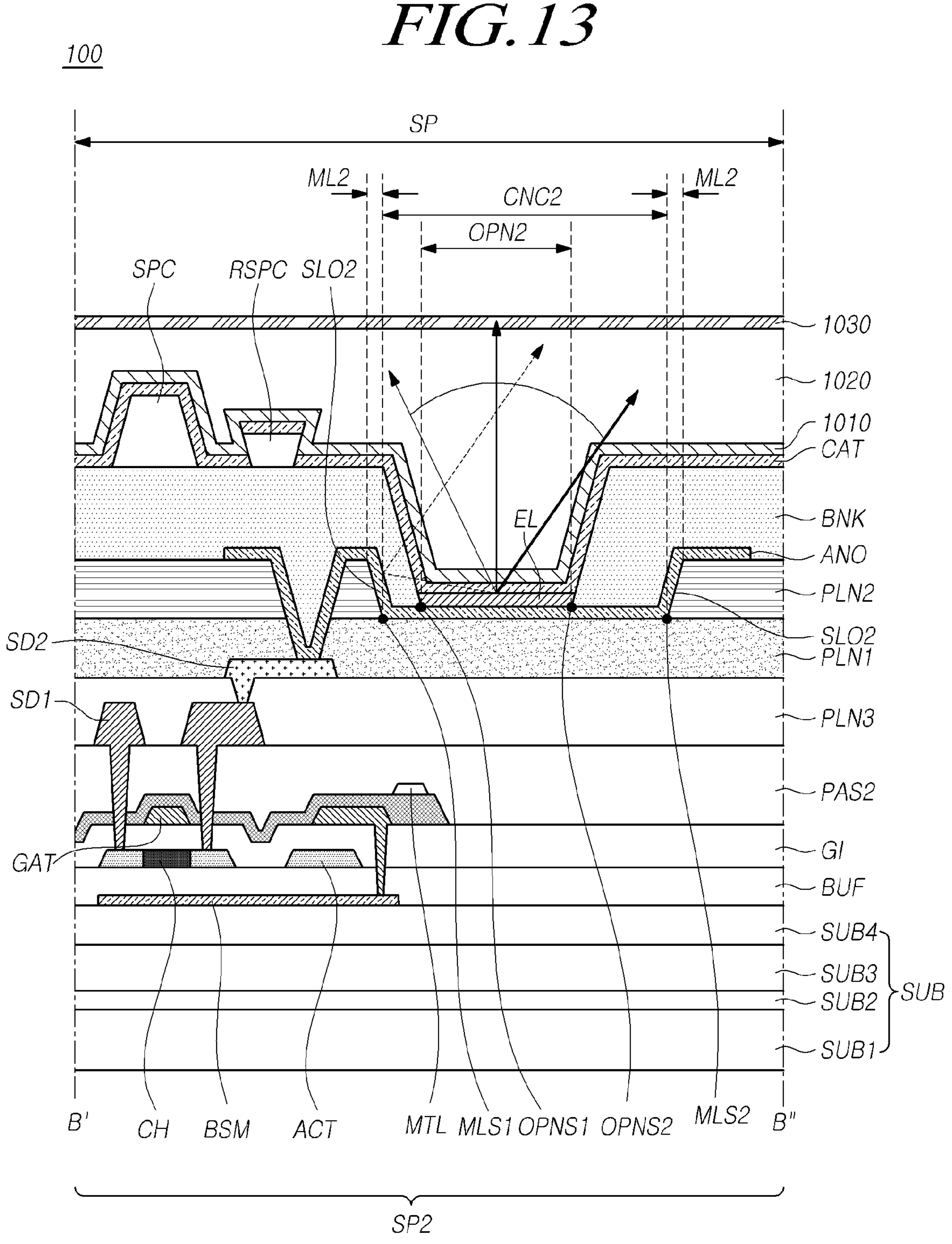

FIG. 13 is a cross-sectional view illustrating a display device according to embodiments of the disclosure. More specifically, in the display device 100 illustrated in FIG. 11, it is a cross-sectional view (B'-B') of a subpixel positioned in area B.

In describing the display device illustrated in FIG. 13, what is not particularly described otherwise is the same as that described above with reference to FIG. 10.

Referring to FIG. 13, the second planarization layer PLN2 may include a concave portion CNC2. In other words, the first planarization layer PLN1 does not include the concave portion CNC2. The second planarization layer PLN2 may include an inclined surface SLO2. On the other hand, the first planarization layer PLN1 that does not include a concave portion does not include an inclined surface.

The reflector ML2 may include a first electrode ANO positioned on the inclined surface SLO2 of the second planarization layer PLN2. The reflector ML2 may be positioned to surround at least a portion of the opening OPN2.

The reflector ML2 may include a first point MLS1 of the reflector ML2 that is closest to the folding axis FA and a second point MLS2 of the reflector ML2 that is farthest from the folding axis FA. The distance between the first point MLS1 of the reflector ML2 and the opening OPN2 may be shorter than the distance between the second point MLS2 of the reflector ML2 and the opening OPN2. When the reflector ML2 positioned close to the folding axis FA is positioned closer to the opening OPN2, light directed to the folding axis FA among the light emitted from the light emitting layer EL positioned in the opening OPN2 may be more effectively reflected from the reflector ML2, so that a limited viewing angle may be provided in the direction of the folding axis FA.

The subpixel illustrated in FIG. 13 may be referred to as a second subpixel SP2, the opening OPN2 may be referred to as a second opening OPN2, and the reflector ML2 may be referred to as a second reflector ML2. The second opening OPN2 and the second reflector ML2 may be positioned in the second subpixel SP2.

Figure 14:
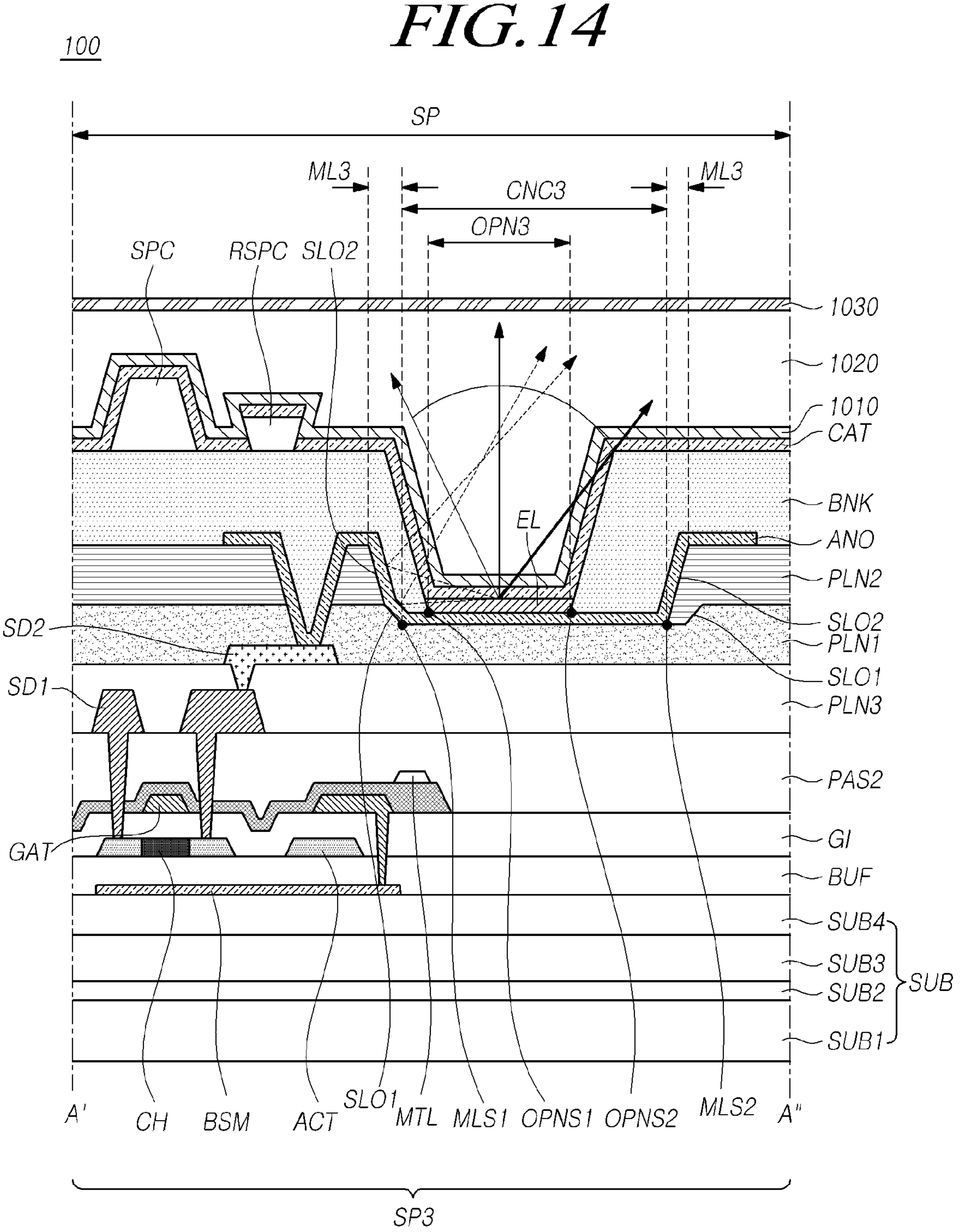

FIG. 14 is a cross-sectional view illustrating a display device according to embodiments of the disclosure. More specifically, in the display device 100 illustrated in FIG. 11, it is a cross-sectional view (A'-A') of a subpixel positioned in area A.

In describing the display device illustrated in FIG. 14, what is not particularly described otherwise is the same as that described above with reference to FIG. 10.

Referring to FIG. 14, the first planarization layer PLN1 may include a concave portion CNC3. The first planarization layer PLN1 may include an inclined surface SLO1. The concave portion CNC3 and the inclined surface SLO1 of the first planarization layer PLN1 may be formed by a patterning process using a halftone mask.

The opening OPN3 may be positioned in the concave portion CNC3 of the first planarization layer PLN1. Since the opening OPN3 is positioned in the concave portion CNC3 of the first planarization layer PLN1, a portion of the light emitted from the light emitting layer EL positioned in the opening OPN3 may be emitted toward the reflector ML3.

The second planarization layer PLN2 may include an inclined surface SLO2. In an example in which the first planarization layer PLN1 and the second planarization layer PLN2 include an inclined surface, the inclined surface SLO1 of the first planarization layer PLN1 may be referred to as a first inclined surface and the inclined surface SLO2 of the second planarization layer PLN2 may be referred to as a second inclined surface to distinguish the inclined surface SLO1 of the first planarization layer PLN1 from the inclined surface SLO2 of the second planarization layer PLN2. The second inclined surface SLO2 may have a larger angle with respect to the substrate SUB than the first inclined surface SLO1. In other words, the second inclined surface SLO2 may have a steeper inclination than the first inclined surface SLO1.

The second inclined surface SLO2 may be positioned to be connected to the first inclined surface SLO1 at a first point OPN1 closest to the folding axis FA of the opening OPN3, and may be positioned closer to the opening OPN3 than the first inclined surface SLO1 at a second point OPN2 farthest from the folding axis FA of the opening OPN3.

The reflector ML3 may include a first electrode ANO positioned on the inclined surface SLO1 of the first planarization layer PLN1 and the inclined surface SLO2 of the second planarization layer PLN2.

The reflector ML3 may include the first electrode ANO positioned on the inclined surface SLO1 of the first planarization layer PLN1 and the inclined surface SLO2 of the second planarization layer PLN2 at a portion close to the folding axis FA, and may include the first electrode ANO positioned on the inclined surface SLO2 of the second planarization layer PLN2 at a portion not close to the folding axis FA.

The reflector ML3 may include a first point MLS1 closest to the folding axis FA and a second point MLS2 farthest from the folding axis FA. The reflector ML3 may include the first electrode ANO positioned on the inclined surface SLO1 of the first planarization layer PLN1 and the inclined surface SLO2 of the second planarization layer PLN2 at the first point MLS1. The reflector ML3 may include the first electrode ANO positioned on the inclined surface SLO2 of the second planarization layer PLN2 at the second point MLS2.

The distance between the first point MLS1 of the reflector ML3 and the opening OPN3 may be shorter than the distance between the second point MLS2 of the reflector ML3 and the opening OPN3. When the reflector ML3 positioned close to the folding axis FA is positioned closer to the opening OPN3, the reflector ML3 may more effectively reflect light directed to the folding axis FA among the light emitted from the light emitting layer EL positioned in the opening OPN3, and thus may have a limited viewing angle in the direction of the folding axis FA.

The subpixel illustrated in FIG. 14 may be referred to as the third subpixel SP3, the opening OPN3 may be referred to as the third opening OPN3, and the reflector ML3 may be referred to as the third reflector ML3.

The second subpixel SP2 may be positioned closer to the folding axis than the first subpixel SP1. The third subpixel SP3 may be positioned closer to the folding axis than the second subpixel SP2.

All of the first to third subpixels described above may include a main light emitting portion and an auxiliary light emitting portion. The main light emitting portion may correspond to the first light emitting portion described above with reference to FIG. 2, and the auxiliary light emitting portion may correspond to the second light emitting portion described above with reference to FIG. 2. For example, the main light emitting portion included in the first subpixel may be referred to as a first light emitting portion, the auxiliary light emitting portion included in the first subpixel may be referred to as a second light emitting portion, the main light emitting portion included in the second subpixel may be referred to as a third light emitting portion, the auxiliary light emitting portion included in the second subpixel may be referred to as a fourth light emitting portion, the main light emitting portion included in the third subpixel may be referred to as a fifth light emitting portion, and the auxiliary light emitting portion included in the third subpixel may be referred to as a sixth light emitting portion.

As described above with reference to FIGS. 12 to 14, in the first subpixel of FIG. 12, the second subpixel of FIG. 13, and the third subpixel of FIG. 14, the first planarization layer PLN1, the second planarization layer PLN2, and the reflectors ML1, ML2, and ML3 may have different structures. These different structures are for allowing subpixels positioned closer to the folding axis to have a smaller viewing angle in the folding axis direction. Thus, the first subpixel, the second subpixel, and the third subpixel emit light with different viewing angles. For example, the first subpixel emits light with a first viewing angle, the second subpixel emits light with a second viewing angle that is greater than the first viewing angle, and the third subpixel emits light with a third viewing angle that is greater than the second viewing angle and the first viewing angle.

More specifically, in the first subpixel, the second subpixel, and the third subpixel illustrated in FIGS. 12 to 14, the reflectors ML1 and ML2 ML3 close to the folding axis FA have different structures. Referring to FIGS. 12 to 14, in the reflectors ML1, ML2, and ML3, at the first point MLS1, the first subpixel SP1 may have the lowest height, the third subpixel SP3 may have the highest height, and the second subpixel may have an intermediate height. A height of the second reflector ML2 with respect to the second opening OPN2 may be larger than a height of the first reflector ML1 with respect to the first opening OPN1. A height of the third reflector ML3 with respect to the third opening OPN3 may be larger than a height of the second reflector ML2 with respect to the second opening OPN2.

When the subpixel has the structure illustrated in FIG. 12, FIG. 13, or FIG. 14 according to the distance from the folding axis FA, it is possible to manufacture the display device by a simplified process while varying the height of the reflector.

By varying the heights of the reflectors ML1, ML2, and ML3 close to the folding axis FA, it is possible to vary the degree to which the viewing angle of the light emitted in the folding axis direction is limited. In other words, as the height of the reflectors ML1, ML2, and ML3 close to the folding axis FA increases, the viewing angle of the light emitted from the subpixel in the direction of the folding axis may be further limited, so that a small viewing angle may be provided.

As described above with reference to FIGS. 12 to 14, the method of limiting the viewing angle of the subpixel closer to the folding axis may allow the first planarization layer PLN1, the second planarization layer PLN2, and the reflectors ML1, ML2, and ML3 to have different structures, but may also be achieved by adjusting the distance between the reflector and the opening closer to the folding axis. For example, it is possible to allow the subpixel to have a smaller viewing angle in the folding axis direction by further decreasing the distance between the reflector and the opening for subpixels closer to the folding axis. For example, all of the subpixels included in the display device may have the same structure as shown in FIG. 12, FIG. 13, or FIG. 14, and the subpixel closer to the folding axis may be allowed to have a small viewing angle in the folding axis direction in such a manner as to further decrease the distance between the reflector closer to the folding axis and the opening for subpixels closer to the folding axis.

For example, the first subpixel may include the first light emitting portion EA1 and the second light emitting portion EA2 shown in FIG. 2, and the second subpixel positioned closer to the folding axis than the first subpixel may include the third light emitting portion and the fourth light emitting portion. The third light emitting portion of the second subpixel may be a light emitting portion corresponding to the first light emitting portion of the first subpixel, and the fourth light emitting portion of the second subpixel may be a light emitting portion corresponding to the second light emitting portion of the first subpixel. In this example, the fourth light emitting portion may be positioned to surround a portion of the third light emitting portion. The distance between the third light emitting portion and the fourth light emitting portion may be smaller than the distance between the first light emitting portion and the second light emitting portion.

For example, the second subpixel may include a third light emitting portion and a fourth light emitting portion, and the third subpixel positioned closer to the folding axis than the second subpixel may include a fifth light emitting portion and a sixth light emitting portion. The fifth light emitting portion of the third subpixel may be a light emitting portion corresponding to the first light emitting portion EA1 described above with reference to FIG. 2, and the sixth light emitting portion of the third subpixel may be a light emitting portion corresponding to the second light emitting portion EA2 described above with reference to FIG. 2. In this example, the fourth light emitting portion may be positioned to surround a portion of the third light emitting portion. The distance between the fifth light emitting portion and the sixth light emitting portion may be smaller than the distance between the third light emitting portion and the fourth light emitting portion.

Embodiments of the disclosure described above are briefly described below.

Embodiments of the disclosure may provide a display device 100 comprising a first subpixel SP, a first light emitting portion EA1 positioned in the first subpixel SP, and a second light emitting portion EA2 positioned in the first subpixel SP.

The second light emitting portion EA2 may be positioned to surround a portion of the first light emitting portion EA1.

The display device 100 may include a folding axis FA.

The second light emitting portion EA2 may be positioned between the first light emitting portion EA1 and the folding axis FA.

The first light emitting portion EA1 may include a first point EA1S1 closest to the folding axis FA and a second point EA1S2 farthest from the folding axis FA.

The second light emitting portion EA2 may be positioned to surround the first point EA1S1 of the first light emitting portion EA1 and not to surround the second point EA1S2 of the first light emitting portion EA1.

The first light emitting portion EA1 and the second light emitting portion EA2 may emit light of different wavelengths.

The first light emitting portion EA1 may be positioned in an opening OPN of the first subpixel SP1.

The second light emitting portion EA2 may be positioned in a non-opening portion of the first subpixel SP1.

The second subpixel SP2 may be positioned closer to the folding axis FA than the first subpixel SP1.

The third light emitting portion may be positioned in the second subpixel SP2.

The fourth light emitting portion may be positioned in the second subpixel SP2 to surround a portion of the third light emitting portion.

The distance between the third light emitting portion and the fourth light emitting portion may be smaller than the distance between the first light emitting portion and the second light emitting portion.

The third subpixel SP3 may be positioned closer to the folding axis FA than the second subpixel SP2.

The fifth light emitting portion may be positioned in the third subpixel SP3.

The sixth light emitting portion may be positioned in the third subpixel SP3 to surround a portion of the fifth light emitting portion.

The distance between the fifth light emitting portion and the sixth light emitting portion may be smaller than the distance between the third light emitting portion and the fourth light emitting portion.

The display device 100 may include a reverse spacer RSPC positioned to surround a portion of the second light emitting portion EA2.

The reverse spacer RSPC may be positioned between the second light emitting portion EA2 and the folding axis FA.

The second light emitting portion EA2 may include a first point EA2S1 closest to the folding axis FA and a second point EA2S2 farthest from the folding axis FA.

The reverse spacer RSPC may surround the first point EA2S1 of the second light emitting portion EA2 and may be positioned not to surround the second point EA2S2 of the second light emitting portion EA2.

Embodiments of the disclosure may provide a display device 100 comprising a substrate SUB including a first subpixel SP1, a first planarization layer PLN1 positioned on the substrate SUB, a second planarization layer PLN2 positioned on the first planarization layer PLN1, a first electrode ANO positioned on the second planarization layer PLN2, a light emitting layer EL positioned on the first electrode ANO, a bank BNK positioned on the first electrode ANO, and a first reflector ML.

The bank BNK may include a first opening OPN1 positioned in the first subpixel SP1.

The first reflector ML1 may be positioned to surround at least a portion of the first opening OPN1 and may be positioned in the first subpixel SP1.

The first reflector ML1 may include a first electrode ANO positioned on an inclined surface SLO1 or SLO2 of at least one of the first planarization layer PLN1 and the second planarization layer PLN2.

The first reflector ML1 may include a first point MLS1 closest to the folding axis FA and a second point MLS2 farthest from the folding axis FA.

The distance between the first point MLS1 of the first reflector ML1 and the first opening OPN1 may be smaller than the distance between the second point MLS2 of the first reflector ML1 and the first opening OPN1.

The substrate SUB may include a second subpixel SP2 positioned closer to the folding axis FA than the first subpixel SP1.

The bank BNK may include a second opening OPN2 positioned in the second subpixel SP2.

The display device may comprise a second reflector ML2 positioned to surround at least a portion of the second opening OPN2 and positioned in the second subpixel SP2.

The second reflector ML2 may include a first electrode ANO positioned on the inclined surface SLO2 of the second planarization layer PLN2.

A height of the second reflector ML2 with respect to the second opening OPN2 may be larger than a height of the first reflector ML1 with respect to the first opening OPN1.

The substrate SUB may include a third subpixel SP3 positioned closer to the folding axis FA than the second subpixel SP2.

The bank BNK may include a third opening OPN3 positioned in the third subpixel SP3.

The display device may comprise a third reflector ML3 positioned to surround at least a portion of the third opening OPN3 and positioned in the third subpixel SP3.

The third reflector ML3 may include a first electrode ANO positioned on the inclined surface SLO1 of the first planarization layer PLN1 and the inclined surface SLO2 of the second planarization layer PLN2.

A height of the third reflector ML3 with respect to the third opening OPN3 may be larger than a height of the second reflector ML2 with respect to the second opening OPN2.

The first reflector ML1 may include a first point MLS1 closest to the folding axis FA and a second point MLS2 farthest from the folding axis FA.

The first reflector ML1 may include a first electrode ANO positioned on the inclined surface SLO1 of the first planarization layer PLN1 at the first point MLS1.

The first reflector ML1 may include a first electrode ANO positioned on the inclined surface SLO1 of the first planarization layer PLN1 at the first point MLS1 and the inclined surface SLO2 of the second planarization layer PLN2 at the second point MLS2.

The first opening OPN1 may be positioned in a concave portion CNC of the first planarization layer PLN1.

The second reflector ML2 may include a first electrode ANO positioned on the inclined surface SLO2 of the second planarization layer PLN2.

The third reflector ML3 may include a first point MLS1 closest to the folding axis FA and a second point MLS2 farthest from the folding axis FA.

The third reflector ML3 may include a first electrode ANO positioned on the inclined surface SLO1 of the first planarization layer PLN1 and the inclined surface SLO2 of the second planarization layer PLN2 at the first point MLS1.

The third reflector ML3 may include a first electrode ANO positioned on the inclined surface SLO1 of the first planarization layer PLN1 at the first point MLS1 and the inclined surface SLO2 of the second planarization layer PLN2 at the second point MLS2.

The third opening OPN3 may be positioned in the concave portion CNC of the first planarization layer PLN1.

The above description has been presented to enable any person skilled in the art to make and use the technical idea of the disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the disclosure. The above description and the accompanying drawings provide an example of the technical idea of the disclosure for illustrative purposes only. That is, the disclosed embodiments are intended to illustrate the scope of the technical idea of the disclosure.

What is claimed:

1. A display device, comprising:
a first subpixel;
a folding axis about which the display device is configured to fold;
a first light emitting portion in the first subpixel, the first light emitting portion containing a first part and a second part, wherein the first part of the first light emitting portion is closer to the folding axis than the second part of the first light emitting portion in a plan view of the display device; and
a second light emitting portion in the first subpixel,
wherein the second light emitting portion surrounds an entirety of a perimeter of the first part of the first light emitting portion in the plan view of the display device,
wherein the second light emitting portion does not surround any portion of a perimeter of the second part of the first light emitting portion in the plan view of the display device,
wherein the second light emitting portion is between the first light emitting portion and the folding axis,
wherein the first light emitting portion comprises a plurality of points including a first point and a second point, the first point closest to the folding axis amongst the plurality of points and the second point farthest from the folding axis amongst the plurality of points, and
wherein the second light emitting portion surrounds the first point of the first light emitting portion without surrounding the second point of the first light emitting portion.

2. The display device of claim 1, wherein the first light emitting portion emits light of a first wavelength and the second light emitting portion emits light of a second wavelength that is different from the first wavelength.

3. The display device of claim 1, wherein the first light emitting portion is in an opening of the first subpixel, and the second light emitting portion is outside of the opening of the first subpixel.

4. A display device, comprising:
a first subpixel;
a folding axis about which the display device is configured to fold;
a first light emitting portion in the first subpixel, the first light emitting portion containing a first part and a second part, wherein the first part of the first light emitting portion is closer to the folding axis than the second part of the first light emitting portion in a plan view of the display device;
a second light emitting portion in the first subpixel;
a second subpixel that is closer to the folding axis than the first subpixel;
a third light emitting portion in the second subpixel; and
a fourth light emitting portion in the second subpixel, the fourth light emitting portion surrounding a portion of a perimeter of the third light emitting portion without surrounding an entirety of the perimeter of the third light emitting portion in the plan view of the display device,
wherein the second light emitting portion surrounds an entirety of a perimeter of the first part of the first light emitting portion in the plan view of the display device,
wherein the second light emitting portion does not surround any portion of a perimeter of the second part of the first light emitting portion in the plan view of the display device,
wherein the second light emitting portion is between the first light emitting portion and the folding axis, and
wherein a distance between the third light emitting portion and the fourth light emitting portion is less than a distance between the first light emitting portion and the second light emitting portion.

5. The display device of claim 4, further comprising:
a third subpixel that is closer to the folding axis than the second subpixel;
a fifth light emitting portion in the third subpixel; and
a sixth light emitting portion in the third subpixel, the sixth light emitting portion surrounding a portion of a perimeter of the fifth light emitting portion without surrounding an entirety of the perimeter of the fifth light emitting portion in the plan view of the display device,
wherein a distance between the fifth light emitting portion and the sixth light emitting portion is less than a distance between the third light emitting portion and the fourth light emitting portion.

6. The display device of claim 1, further comprising:
a reverse spacer that surrounds a portion of a perimeter of the second light emitting portion.

7. A display device, comprising:
a first subpixel;
a folding axis about which the display device is configured to fold;
a first light emitting portion in the first subpixel, the first light emitting portion containing a first part and a second part, wherein the first part of the first light emitting portion is closer to the folding axis than the second part of the first light emitting portion in a plan view of the display device;
a second light emitting portion in the first subpixel; and
a reverse spacer that surrounds a portion of a perimeter of the second light emitting portion,
wherein the second light emitting portion surrounds an entirety of a perimeter of the first part of the first light emitting portion in the plan view of the display device,
wherein the second light emitting portion does not surround any portion of a perimeter of the second part of the first light emitting portion in the plan view of the display device, and
wherein the reverse spacer is between the second light emitting portion and the folding axis.

8. The display device of claim 6, further comprising:
a folding axis about which the display device is configured to fold,
wherein the second light emitting portion comprises a plurality of points including a first point and a second point, the first point closest to the folding axis amongst the plurality of points and the second point farthest from the folding axis amongst the plurality of points, and
wherein the reverse spacer surrounds the first point of the second light emitting portion without surrounding the second point of the second light emitting portion.

* * * * *